United States Patent
Ikeura et al.

(10) Patent No.: US 10,615,079 B2
(45) Date of Patent: Apr. 7, 2020

(54) SEMICONDUCTOR DEVICE AND METHOD FOR MANUFACTURING THE SAME

(71) Applicant: DENSO CORPORATION, Kariya, Aichi-pref. (JP)

(72) Inventors: Shogo Ikeura, Kariya (JP); Yusuke Nonaka, Kariya (JP); Shinichirou Yanagi, Kariya (JP); Seiji Noma, Kariya (JP); Shinya Sakurai, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/074,239

(22) PCT Filed: Mar. 13, 2017

(86) PCT No.: PCT/JP2017/009965
§ 371 (c)(1),
(2) Date: Jul. 31, 2018

(87) PCT Pub. No.: WO2017/175544
PCT Pub. Date: Oct. 12, 2017

(65) Prior Publication Data
US 2019/0279906 A1    Sep. 12, 2019

(30) Foreign Application Priority Data

Apr. 6, 2016    (JP) .................................. 2016-76719

(51) Int. Cl.
*H01L 21/70*    (2006.01)
*H01L 21/8238*    (2006.01)
(Continued)

(52) U.S. Cl.
CPC ........ *H01L 21/8238* (2013.01); *H01L 27/092* (2013.01); *H01L 27/1207* (2013.01);
(Continued)

(58) Field of Classification Search
CPC .................................................. H01L 21/8238
(Continued)

(56) References Cited

U.S. PATENT DOCUMENTS

| 5,744,994 A | 4/1998 | Williams |
| 5,929,690 A | 7/1999 | Williams |

(Continued)

FOREIGN PATENT DOCUMENTS

| JP | 2000-307105 A | 11/2000 |
| JP | 2009-290140 A | 12/2009 |

(Continued)

*Primary Examiner* — Ajay Arora
(74) *Attorney, Agent, or Firm* — Posz Law Group, PLC (57) ABSTRACT

A buried n-type region is provided in a surface layer portion of an n-type body layer of a Pch MOSFET. This makes it possible to lower the threshold voltage Vt. In a portion of the n-type body layer other than the buried n-type region, since an n-type impurity concentration can be kept relatively high, the threshold voltage Vt can be lowered while securing an on-breakdown voltage. Furthermore, since an accumulation region is configured by an n-type active layer, a partial high concentration portion is not formed in a p-type drift layer. Therefore, as in the case where the partial high concentration portion is generated in the p-type drift layer, a reduction in a breakdown voltage caused by an electric field concentration can be restricted from occurring with a distribution in which equipotential lines are concentrated.

8 Claims, 6 Drawing Sheets

(51) Int. Cl.
*H01L 27/092* (2006.01)
*H01L 29/08* (2006.01)
*H01L 29/66* (2006.01)
*H01L 29/78* (2006.01)
*H01L 29/786* (2006.01)
*H01L 27/12* (2006.01)

(52) U.S. Cl.
CPC .... *H01L 29/0878* (2013.01); *H01L 29/66681* (2013.01); *H01L 29/78* (2013.01); *H01L 29/786* (2013.01); *H01L 29/7816* (2013.01); *H01L 29/7835* (2013.01)

(58) Field of Classification Search
USPC .......................................... 257/369; 438/199
See application file for complete search history.

(56) References Cited

U.S. PATENT DOCUMENTS

| | | | |
|---|---|---|---|
| 2007/0034944 A1* | 2/2007 | Xu | H01L 29/402 257/335 |
| 2009/0267144 A1 | 10/2009 | Kobayashi et al. | |
| 2011/0127602 A1* | 6/2011 | Mallikarjunaswamy | H01L 21/823807 257/331 |
| 2011/0163377 A1 | 7/2011 | Kobayashi et al. | |

FOREIGN PATENT DOCUMENTS

| | | |
|---|---|---|
| JP | 2010-165894 A | 7/2010 |
| JP | 2014-165293 A | 9/2014 |

\* cited by examiner

SEMICONDUCTOR DEVICE AND METHOD FOR MANUFACTURING THE SAME

CROSS REFERENCE TO RELATED APPLICATIONS

This application is a U.S. national phase of International Application No. PCT/JP2017/009965 filed on Mar. 13, 2017 and is based on Japanese Patent Application No. 2016-76719 filed on Apr. 6, 2016, the disclosures of which are incorporated herein by reference.

TECHNICAL FIELD

The present disclosure relates to a semiconductor device having LDMOS (abbreviation of laterally diffused metal oxide semiconductor), and is suitable for application to a semiconductor device, for example, in which a Pch MOSFET and an Nch MOSFET are mixedly mounted on the same substrate and a manufacturing method for the semiconductor device.

BACKGROUND ART

In recent years, there has been a demand for higher breakdown voltage of the gate breakdown voltage for an LDMOS used as a level shifter and a high breakdown voltage switch in order to reduce a circuit in size. When the gate breakdown voltage is higher, since a high voltage can be subjected to level shift at a time, the circuit can be simplified such that the number of LDMOS elements can be reduced in a level shifter.

For example, the LDMOS in which a gate insulating film is formed of an LOCOS (abbreviation of local oxidation of silicon) film for element isolation has been developed. In addition, in response to recent low-temperature processes, development of a MOSFET with a high breakdown voltage which can be used as a substitute for the LOCOS film has also been expected, and an STI abbreviation of (shallow trench isolation) film has been considered to be used as a gate oxide film.

For example, an LDMOS disclosed in Patent Literature 1 has been proposed. In the LDMOS, an n-type well layer is provided on a surface of a p-type semiconductor substrate, an n-type base region is formed in a surface layer portion of the n-type well layer, and a p-type source region is formed so as to terminate in the n-type base region. A p-type low concentration diffusion layer corresponding to a buffer layer is formed in the surface layer portion of the n-type well layer at a position distant from the n-type base region, and a p-type drain region is formed so as to terminate in the p-type low concentration diffusion layer. Furthermore, an LOCOS film and a gate insulating film are formed between the p-type source region and the p-type drain region, and a gate electrode is formed on surfaces of the LOCOS film and the gate insulating film. A p-type surface diffusion layer is formed in a portion of the n-type well layer, which is located between the n-type base region and the buffer layer, that is, in the surface layer portion in a so-called accumulation region, so as to connect the n-type base region and the buffer layer. In this way, the surface layer portion of the accumulation region is formed of the p-type surface diffusion layer, to thereby reduce an on-resistance as compared with a case where the surface layer portion in the accumulation region is formed of only the n-type well layer.

PRIOR ART LITERATURE

Patent Literature

Patent Literature 1 JP 2009-267211 A

SUMMARY OF INVENTION

However, when the p-type surface diffusion layer is formed in the accumulation region, the breakdown voltage drops. In other words, in a structure in which the p-type surface diffusion layer is formed in the accumulation region, a portion where the p-type surface diffusion layer and the p-type low concentration diffusion layer corresponding to the buffer layer overlap with each other, resulting in a relatively high concentration occurs. This causes a distribution in which equipotential lines concentrate so as to pass through a region of the relatively high concentration, a dense region is generated in the equipotential distribution of the LDMOS, and a breakdown voltage drop occurs due to an electric field concentration.

In addition, when the gate insulating film is formed of the LOCOS film or an STI film in the LDMOS, since the gate insulating film becomes a thick film, there is a drawback that a threshold voltage Vt increases and an operating voltage of a circuit into which the LDMOS is incorporated increases. In particular, in the case of using the STI film, a film is formed by a CVD (chemical vapor deposition) method rather than thermal oxidation like the LOCOS film, and the film is not dense as compared with the LOCOS film. Therefore, in order to realize the same reliability as that of the LOCOS film, the film is required to be thicker. For that reason, the drawback that the threshold voltage Vt becomes high is more conspicuous.

In view of the foregoing, it is an object of the present disclosure to provide a semiconductor device capable of further improving a breakdown voltage and reducing a threshold voltage Vt and a method for manufacturing the semiconductor device.

A semiconductor device according to an aspect of the present disclosure includes an LDMOS of a second conductivity type channel that has: a semiconductor substrate that includes a semiconductor layer of a first conductivity type; a body layer of the first conductivity type which is disposed in the semiconductor layer and has an impurity concentration higher than that of the semiconductor layer; a source region of a second conductivity type which is terminated in the body layer and disposed in a surface layer portion of the body layer; a drift layer of the second conductivity type which is disposed away from the body layer in the semiconductor layer; a drain region of the second conductivity type which is disposed in the drift layer and has an impurity concentration higher than that of the drift layer; a gate insulating film that is disposed between the source region and the drain region; a gate electrode that is disposed on a portion of the gate insulating film corresponding to a portion in contact with the body layer; a source electrode that is connected to the source region; and a drain electrode that is connected to the drain region. The body layer has a portion configuring a channel region at a position is in contact with the gate insulating film, and the portion configuring the channel region is a buried region that contains impurities of the second conductivity type and has a lower carrier concentration than that of a remaining portion of the body layer.

In this manner, the buried region is provided in the surface layer portion of the body layer of the LDMOS of the second conductivity type channel. This makes it possible to lower the threshold voltage Vt. Further, in a portion of the body layer other than the buried region, since the impurity concentration of the first conductivity type can be kept relatively high, the threshold voltage Vt can be lowered while securing the on-breakdown voltage. Furthermore, since the accumulation region is configured by the semiconductor layer of the first conductivity type, a partial high concentration portion is not formed in the drift layer as in the case of forming the p-type surface diffusion layer disclosed in Patent Literature 1. Therefore, as in the case where a portion having a high concentration is partially generated in the drift layer, a reduction in the breakdown voltage caused by an electric field concentration can be prevented from occurring with the distribution in which the equipotential lines are concentrated.

DESCRIPTION OF EMBODIMENTS

Hereinafter, embodiments of the present disclosure will be described below with reference to the drawings. In the following respective embodiments, parts identical with or equivalent to each other are denoted by the same symbols for description.

First Embodiment

A first embodiment will be described. In the present embodiment, as a semiconductor device having an LDMOS, a semiconductor device in which a Pch MOSFET and an Nch MOSFET are mixedly mounted on the same substrate will be described.

Figure 1:
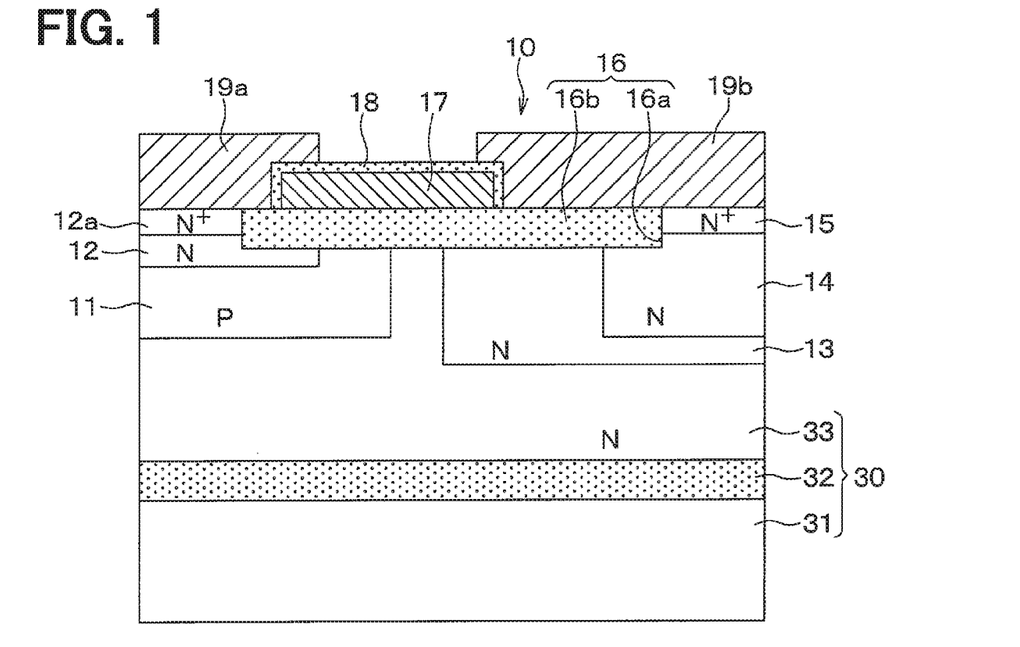
FIG. 1 is a cross-sectional view of an Nch MOSFET provided in a semiconductor device according to a first embodiment.
Figure 2:
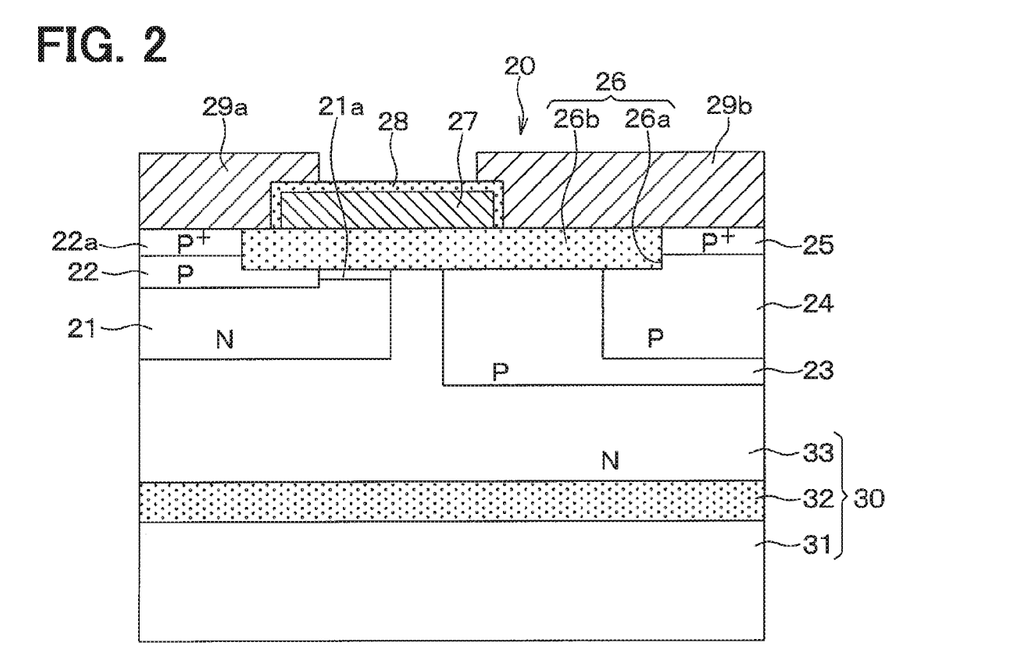
FIG. 2 is a cross-sectional view of a Pch MOSFET provided in the semiconductor device according to the first embodiment.

In the semiconductor device of the present embodiment, an Nch type LDMOS (hereinafter simply referred to as an Nch MOSFET) 10 shown in FIG. 1 and a Pch type LDMOS (hereinafter simply referred to as a Pch MOSFET) 20 shown in FIG. 2 are mixedly mounted on the same substrate. FIGS. 1 and 2 show cross sections of different regions in the semiconductor device according to the present embodiment. However, the Nch MOSFET 10 and the Pch MOSFET 20 shown in those figures are both mounted on the same substrate, that is, mixedly mounted in one chip.

As shown in FIGS. 1 and 2, in the semiconductor device according to the present embodiment, a semiconductor substrate is formed of an SOI (silicon on insulator) substrate 30. The SOI substrate 30 is of an SOI structure in which an active layer 33 is disposed over a support substrate 31 made of a semiconductor such as silicon across a buried oxide film 32. In the case of the present embodiment, the active layer 33 is formed of an n-type silicon substrate having a predetermined impurity concentration. The Nch MOSFET 10 and the Pch MOSFET 20 are formed over the active layer 33. Although not shown, the Nch MOSFET 10 and the Pch MOSFET 20 are isolated from each other by an element isolation structure or the like.

As shown in FIG. 1, the Nch MOSFET 10 includes a p-type body layer 11 that is formed in a surface layer portion of the active layer 33 and an n-type source region 12 that is formed in a surface layer portion of the p-type body layer 11. The n-type source region 12 is terminated in the p-type body layer 11 and a surface portion of the n-type source region 12 is formed as an $n^+$-type contact region 12a which is set to be higher in n-type impurity concentration than a lower layer portion of the n-type source region 12. The $n^+$-type contact region 12a is exposed on a surface of the active layer 33.

Further, an n-type drift layer 13 is formed at a position apart from the p-type body layer 11 in the surface layer portion of the active layer 33, and an n-type buffer layer 14 is further formed inside the n-type drift layer 13. The n-type buffer layer 14 is formed so as to terminate on a surface of the n-type drift layer 13, and is set to be higher in the n-type impurity concentration than the n-type drift layer 13. An $n^+$-type drain region 15 having an impurity concentration higher than that of the n-type buffer layer 14 is formed in a surface layer portion of the n-type buffer layer 14, and the $n^+$-type drain region 15 is exposed from the surface of the active layer 33.

Furthermore, an STI film 16 is formed between the $n^+$-type contact region 12a and the $n^+$-type drain region 15 in the active layer 33. The STI film 16 is formed by embedding an insulating film 16b in a trench 16a defined in the active layer 33. The STI film 16 configures a gate insulating film and isolates a source and a drain from each other.

A gate electrode 17 made of doped polysilicon or the like is formed on a surface of the STI film 16. The gate electrode 17 is formed at least at a position opposing to a surface of the p-type body layer 11 which is in contact with the STI film 16, that is, at a position opposing to a portion of the surface portion of the p-type body layer 11 which is located between the n-type source region 12 and the active layer 33. For that reason, when a gate voltage is applied to the gate electrode 17, a channel is provided in the surface of the p-type body layer 11.

In addition, a surface of the gate electrode 17 is covered with an insulating film 18, a source electrode 19a and a drain electrode 19b are formed on the insulating film 18, and a gate wire is also formed in a cross section different from that in FIG. 1. The source electrode 19a is in contact with the $n^+$-type contact region 12a and the drain electrode 19b is in contact with the $n^+$-type drain region 15. The gate wiring is connected to the gate electrode 17 through a contact hole or the like provided in the insulating film 18 so that a desired gate voltage can be applied to the gate electrode 17 from an outside through the gate wire. With the structure described above, the Nch MOSFET 10 is configured.

On the other hand, the Pch MOSFET 20 includes an n-type body layer 21 that is formed in the surface layer portion of the active layer 33 and a p-type source region 22 that is formed in a surface layer portion of the n-type body layer 21. The p-type source region 22 is terminated in the n-type body layer 21 and a surface portion of the p-type source region 22 is formed as a $p^+$-type contact region 22a which is set to be higher in p-type impurity concentration than a lower layer portion of the p-type source region 22. The $p^+$-type contact region 22a is exposed from the surface of the active layer 33.

Furthermore, in the Pch MOSFET 20, a buried n-type region 21a is formed in a portion of the surface portion of the n-type body layer 21, which is located between the p-type source region 22 and the active layer 33. The buried n-type region 21a is set to be lower in carrier concentration than other portions of the n-type body layer 21. The buried n-type region 21a is formed by implanting a p-type impurity into the surface portion of the n-type body layer 21, and a part of the n-type impurity is canceled out by the p-type impurity, to thereby lower the carrier concentration.

Further, a p-type drift layer 23 is formed at a position apart from the n-type body layer 21 in the surface layer portion of the active layer 33, and a p-type buffer layer 24 is further formed inside the p-type drift layer 23. The p-type buffer layer 24 is formed so as to terminate on a surface of the p-type drift layer 23, and is set to be higher in the p-type impurity concentration than the p-type drift layer 23, A $p^+$-type drain region 25 having an impurity concentration higher than that of the p-type buffer layer 24 is formed in a surface layer portion of the p-type buffer layer 24, and the $p^+$-type drain region 25 is exposed from the surface of the active layer 33.

Furthermore, an STI film 26 is formed between the $n^+$-type contact region 22a and the $p^+$-type drain region 25 in the active layer 33. The STI film 26 is formed by embedding an insulating film 26b in a trench 26a defined in the active layer 33. The STI film 26 configures a gate insulating film and isolates a source and a drain from each other.

A gate electrode 27 made of doped polysilicon or the like is formed on a surface of the STI film 26. The gate electrode 27 is formed at least at a position opposing to a surface of the n-type body layer 21 which is in contact with the STI film 26, that is, at a position opposing to a portion of the surface portion of the n-type body layer 21 which is located between the p-type source region 22 and the active layer 33.

For that reason, when a gate voltage is applied to the gate electrode 27, a channel is provided in the surface of the n-type body layer 21.

In addition, a surface of the gate electrode 27 is covered with an insulating film 28, a source electrode 29a and a drain electrode 29b are formed on the insulating film 28, and a gate wire is also formed in a cross section different from that in FIG. 2. The source electrode 29a is in contact with the $n^+$-type contact region 22a and the drain electrode 29b is in contact with the $p^+$-type drain region 25. The gate wiring is connected to the gate electrode 27 through a contact hole or the like provided in the insulating film 28 so that a desired gate voltage can be applied to the gate electrode 27 from the outside through the gate wire. With the structure described above, the Pch MOSFET 20 is configured.

Although the buried n-type region 21a described above is formed in the surface portion of the n-type body layer 21, the buried n-type region 21a is not formed in an upper layer portion of an accumulation region provided between the n-type body layer 21 and the p-type drift layer 23 to be described later. For that reason, the accumulation region is also of the n-type in a portion which is in contact with the STI film 26. A width of the accumulation region, that is, a distance between the n-type body layer 21 and the p-type drift layer 23 is appropriately set based on a breakdown voltage design and an Id-Vd characteristic of the MOSFET, that is, a design of the flowability of a current.

As described above, the Nch MOSFET 10 and the Pch MOSFET 20 are formed, and those MOSFETs are formed together on the same SOI substrate 30, to thereby configure the semiconductor device according to the present embodiment.

Subsequently, a method of manufacturing the semiconductor device according to the present embodiment configured as described above will be described with reference to FIGS. 3A to 3H and FIGS. 4A to 4I. FIGS. 3A to 3H show a process of manufacturing the Nch MOSFET 10 and FIGS. 4A to 4I show a process of manufacturing the Pch MOSFET 20. The Nch MOSFET 10 and the Pch MOSFET 20 are not manufactured in separate processes, but are manufactured while performing partially common processes. For that reason, a process of manufacturing the Nch MOSFET 10 will be first described, and a process of manufacturing the Pch MOSFET 20 will be then described together with a relationship with the process of manufacturing the Nch MOSFET 10.

Figure 3A:
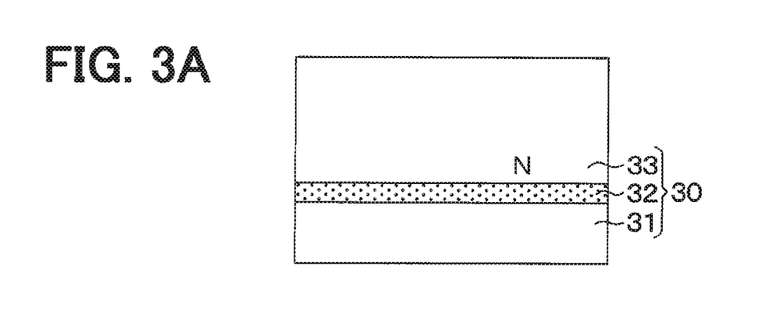
FIG. 3A is a cross-sectional view showing a process of manufacturing the Nch MOSFET shown in FIG. 1.
Figure 3B:
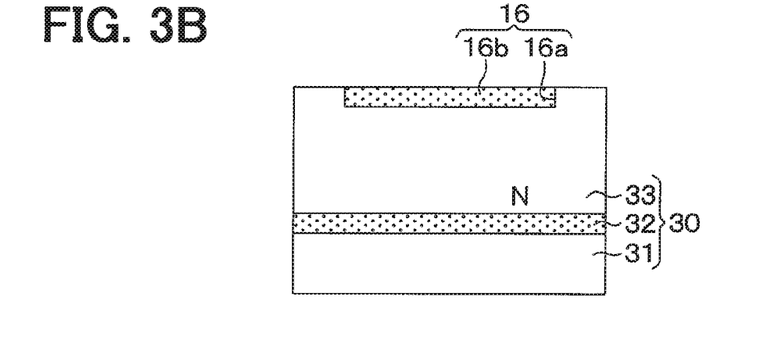
FIG. 3B is a cross-sectional view showing a manufacturing process subsequent to FIG. 3A.

First, the process of manufacturing the Nch MOSFET 10 will be described. As shown in FIG. 3A, after preparing the SOI substrate 30, as shown in FIG. 3B, a mask not shown in which a region where the STI film 16 is to be formed is opened is formed, and the trench 16a is formed by etching. Then, after the trench 16a is filled with the insulating film 16b such as an oxide film by a CVD method, the insulating film 16b formed on the surface of the active layer 33 is removed by planarization to leave the insulating film 16b only in the trench 16a. As a result, the STI film 16 is formed.

Figure 3C:
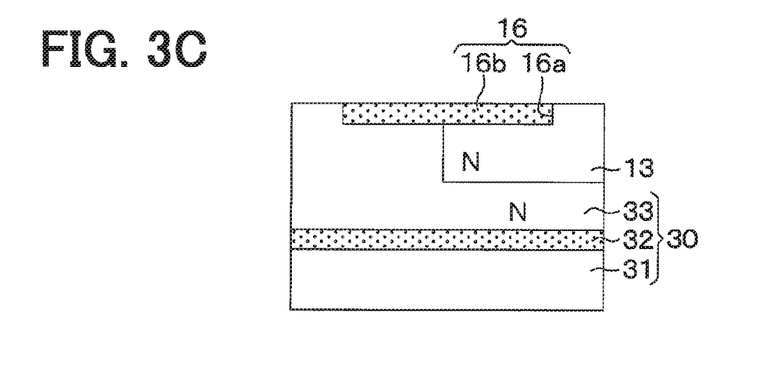
FIG. 3C is a cross-sectional view showing a manufacturing process subsequent to FIG. 3B.
Figure 3D:
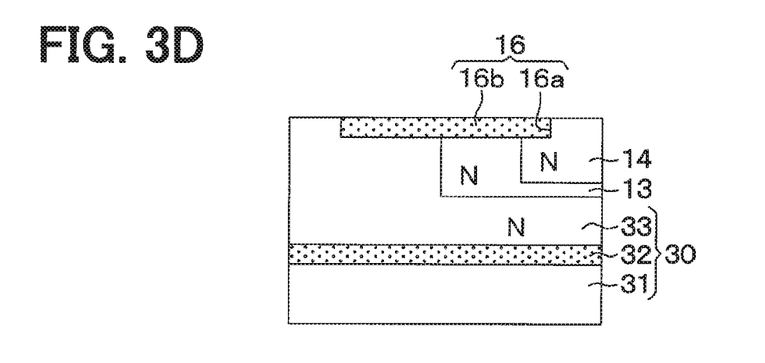
FIG. 3D is a cross-sectional view showing a manufacturing process subsequent to FIG. 3C.

Next, as shown in FIG. 3C, the n-type impurity is ion-implanted with the use of a mask not shown in which a region where the n-type drift layer 13 is to be formed is opened to form the n-type drift layer 13. Next, as shown in FIG. 3D, the n-type impurity is ion-implanted with the use of a mask not shown in which a region where the n-type buffer layer 14 is to be formed is opened, to thereby form the n-type buffer layer 14. At that time, since the n-type buffer layer 14 is formed by further implanting the n-type impurity in addition to the n-type impurity implanted in forming the n-type drift layer 13, the n-type buffer layer 14 is higher in the n-type impurity concentration than the n-type drift layer 13.

Figure 3E:
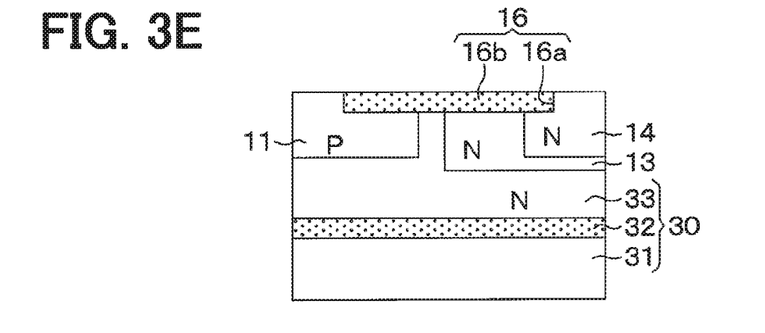
FIG. 3E is a cross-sectional view showing a manufacturing process subsequent to FIG. 3D.
Figure 3F:
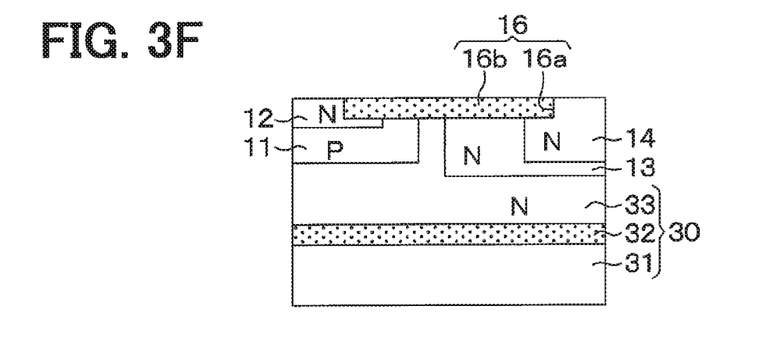
FIG. 3F is a cross-sectional view showing a manufacturing process subsequent to FIG. 3E.

Next, as shown in FIG. 3E, the p-type impurity is ion-implanted with the use of a mask not shown in which a region where the p-type body layer 11 is to be formed is opened, to form the p-type body layer 11. Next, as shown in FIG. 3F, the n-type impurity is ion-implanted into one end of the STI film 16 with the use of a mask not shown in which a region where the n-type source region 12 is to be formed is opened, to thereby form the n-type source region 12.

Figure 3G:
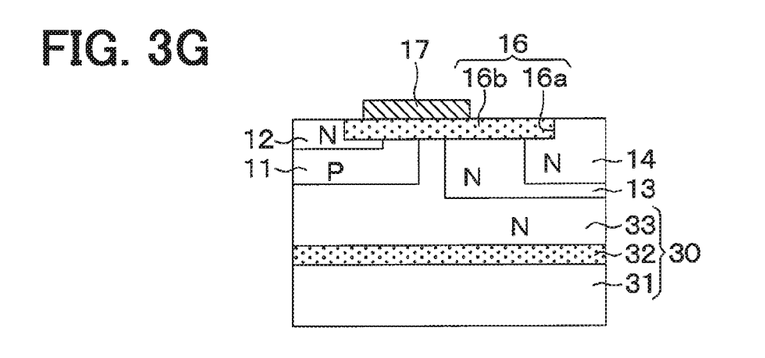
FIG. 3G is a cross-sectional view showing a manufacturing process subsequent to FIG. 3F.
Figure 3H:
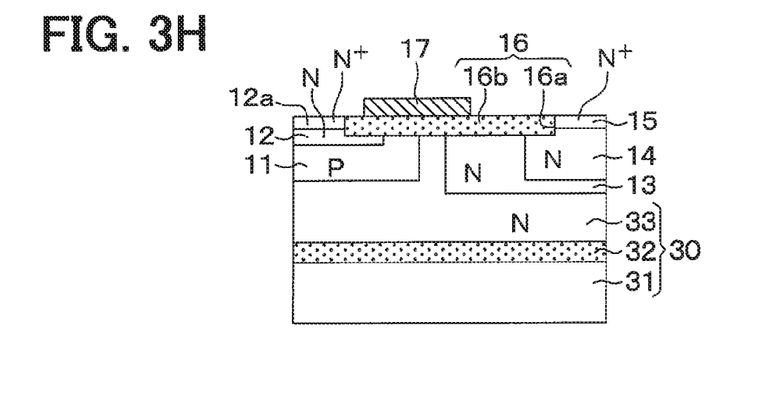
FIG. 3H is a cross-sectional view showing a manufacturing process subsequent to FIG. 3G.

Further, as shown in FIG. 3G, after a polysilicon film has been formed on the surface of the active layer 33 including the surfaces such the STI film 16, the polysilicon film is patterned and left on the STI film 16 to form the gate electrode 17. As shown in FIG. 3H, the n-type impurity is ion-implanted, to thereby form an $n^+$-type contact region 12a adjacent to an end of the STI film 16 and form an $n^+$-type drain region 15 adjacent to the other end of the STI film 16. In this situation, a range of the ion implantation is set to be smaller than a thickness of the STI film 16, and the $n^+$-type contact region 12a and the $n^+$-type drain region 15 are formed at positions where the STI film 16 is not formed.

Although a subsequent process is not shown in the drawing, the gate electrode 17 is doped with a desired impurity at a desired position if necessary. After a process of forming the insulating film 18 has been performed, a contact hole forming process is performed. Further, an electrode material is formed and then patterned to form the source electrode 19a, the drain electrode 19b, and a gate wire not shown. In this manner, the Nch MOSFET 10 can be manufactured.

Figure 4A:
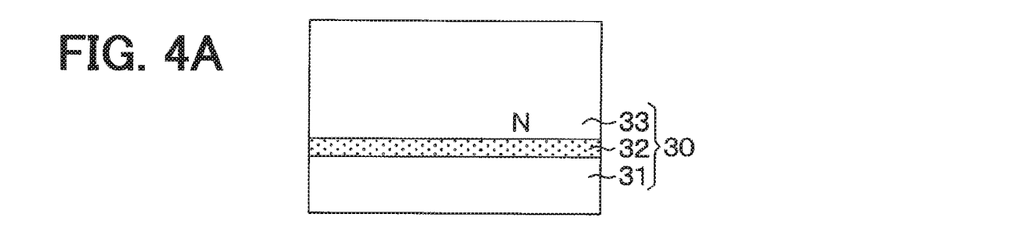
FIG. 4A is a cross-sectional view showing a process of manufacturing the Pch MOSFET shown in FIG. 2.
Figure 4B:
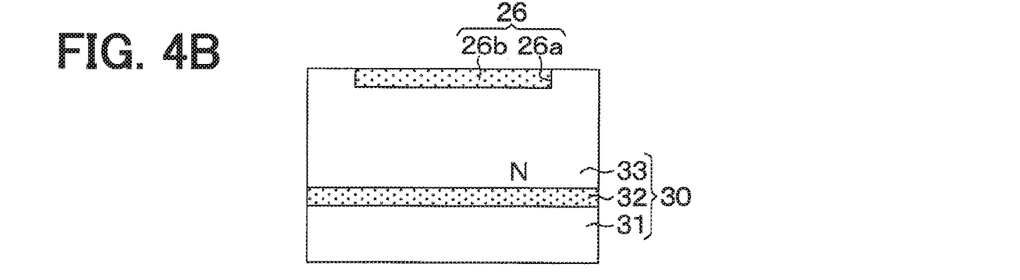
FIG. 4B is a cross-sectional view showing a manufacturing process subsequent to FIG. 4A.

Subsequently, a process of manufacturing the Pch MOSFET 20 will be described. As shown in FIG. 4A, after the SOI substrate 30 has been prepared, as shown in FIG. 4B, a mask not shown in which a region where the STI film 26 is to be formed is opened is formed, and the trench 26a is formed by etching. Then, after the trench 26a has been filled with the insulating film 26b such as an oxide film by the CVD method, the insulating film 26b formed on the surface of the active layer 33 is removed by planarization, and the insulating film 26b is left only in the trench 26a. As a result, the STI film 26 is formed. The processes shown in FIGS. 4A and 4B are performed as the same processes as those in FIGS. 3A and 3B.

Figure 4C:
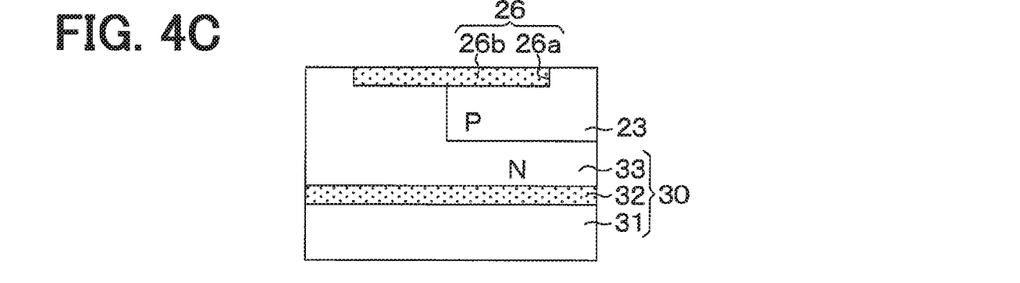
FIG. 4C is a cross-sectional view showing a manufacturing process subsequent to FIG. 4B.
Figure 4D:
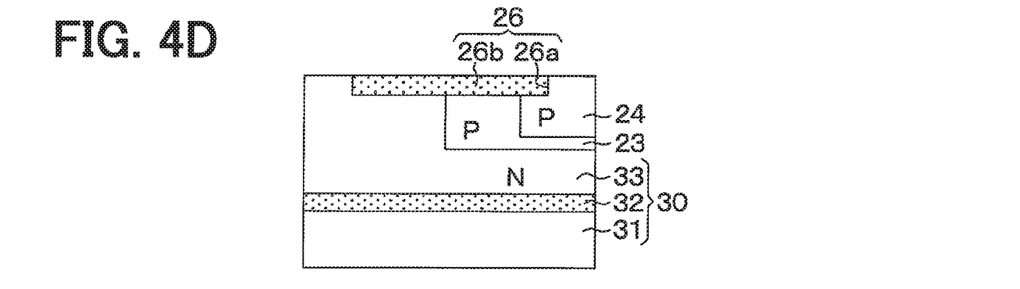
FIG. 4D is a cross-sectional view showing a manufacturing process subsequent to FIG. 4C.

Next, as shown in FIG. 4C, the p-type impurity is ion-implanted with the use of a mask not shown in which a region where the p-type drift layer 23 is to be formed is opened to form the p-type drift layer 23. Next, as shown in FIG. 4D, the p-type impurity is ion-implanted with the use of a mask not shown in which a region where the p-type buffer layer 24 is to be formed is opened, to thereby form the p-type buffer layer 24. At that time, since the p-type buffer layer 24 is formed by further implanting the p-type impurity in addition to the p-type impurity implanted in forming the p-type drift layer 23, the p-type buffer layer 24 is higher in the p-type impurity concentration than the p-type drift layer 23.

Figure 4E:
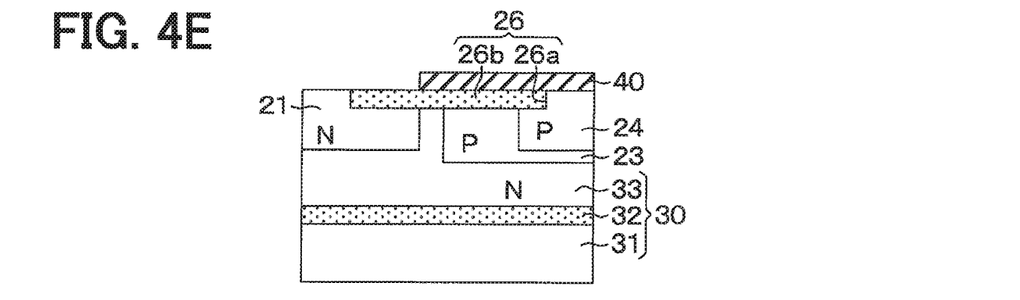
FIG. 4E is a cross-sectional view showing a manufacturing process subsequent to FIG. 4D.
Figure 4F:
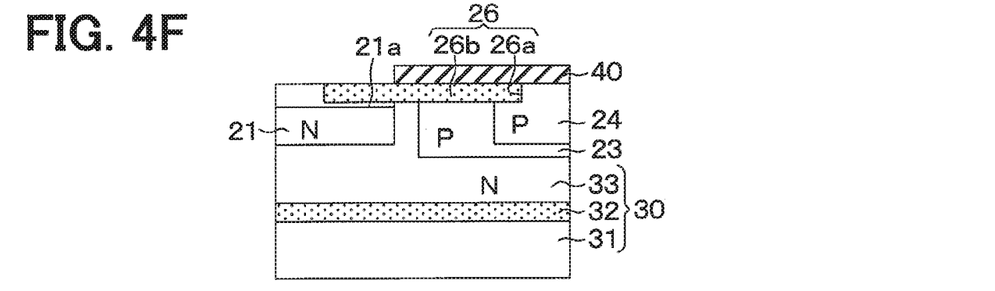
FIG. 4F is a cross-sectional view showing a manufacturing process subsequent to FIG. 4E.

Next, as shown in FIG. 4E, the n-type impurity is ion-implanted with the use of a mask 40 in which a region where the n-type body layer 21 is to be formed is opened, to form the n-type body layer 21. Thereafter, as shown in FIG. 4F, the p-type impurity is ion-implanted with the use of the mask 40 used in forming the n-type body layer 21 as it is to form the buried n-type region 21a. The dose amount of the p-type impurity at this time is comparable with the degree that the n-type body layer 21 is not inverted to the p-type, and the carrier concentration when the implanted p-type impurity and the n-type impurity included in the n-type body layer 21 cancel each other out is set to a desired concentration.

As described above, since the same mask 40 is used for ion implantation for forming the n-type body layer 21 and the buried n-type region 21a, mask misalignment does not occur. Therefore, the n-type body layer 21 and the buried n-type region 21a can be formed in a self-aligned manner without misalignment.

Figure 4G:
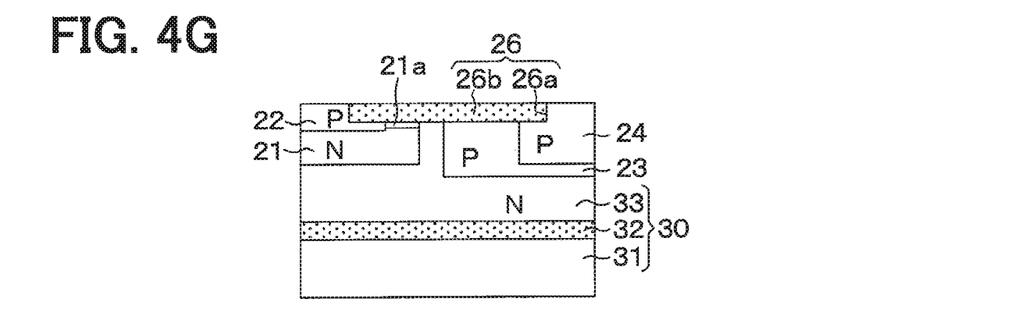
FIG. 4G is a cross-sectional view showing a manufacturing process subsequent to FIG. 4F.
Figure 4H:
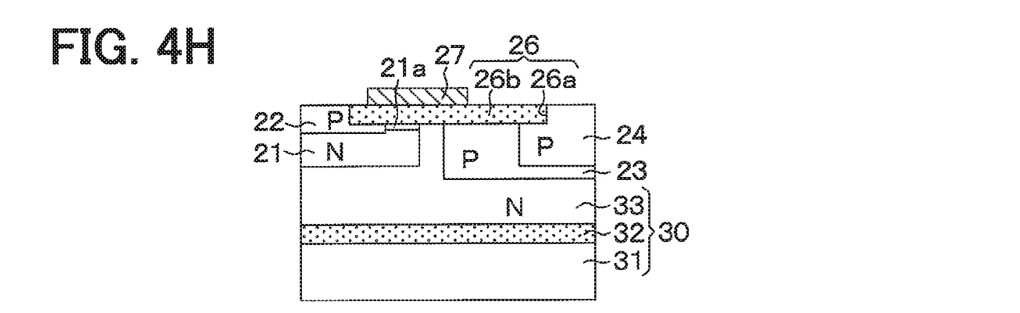
FIG. 4H is a cross-sectional view showing a manufacturing process subsequent to FIG. 4G.

In addition, as shown in FIG. 4G, the p-type impurity is ion-implanted with the use of a mask not shown in which a region where the p-type source region 22 is to be formed is opened, to thereby form the p-type source region 22 adjacent to an end of the STI film 26. Further, as shown in FIG. 4H, after a polysilicon film has been formed on the surface of the active layer 33 including the surfaces such the STI film 26, the polysilicon film is patterned and left on the STI film 26 to form the gate electrode 27. Incidentally, the process of FIG. 4H is performed as the same process as the process of FIG. 3G.

Figure 4I:
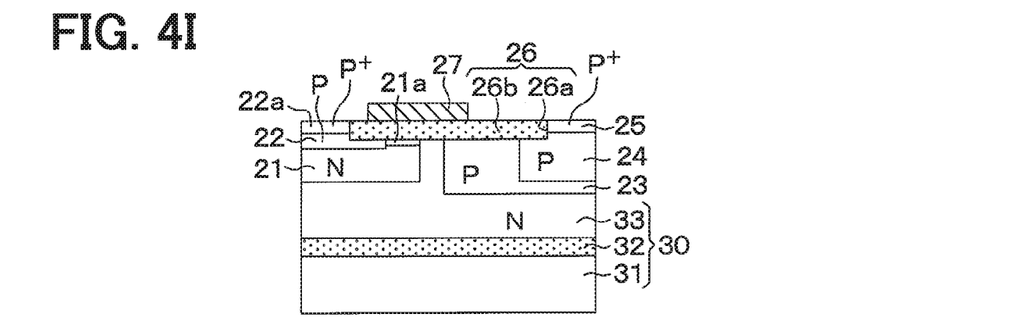
FIG. 4I is a cross-sectional view showing a manufacturing process subsequent to FIG. 4G.

As shown in FIG. 4I, the p-type impurity is ion-implanted, to thereby form an $p^+$-type contact region 22a adjacent to the end of the STI film 26 and form a $p^+$-type drain region 25 adjacent to the other end of the STI film 26. In this situation, a range of the ion implantation is set to be smaller than a thickness of the STI film 26, and the $p^+$-type contact region 22a and the $p^+$-type drain region 25 are formed at positions where the STI film 26 is not formed.

Although a subsequent process is not shown in the drawing, the gate electrode 27 is doped with a desired impurity at a desired position if necessary. After a process of forming the insulating film 28 has been performed, a contact hole forming process is performed. Further, an electrode material is formed and then patterned to form the source electrode 29a, the drain electrode 29b, and a gate wire not shown. In this manner, the Pch MOSFET 20 can be manufactured.

As described above, a semiconductor device including the Nch MOSFET 10 and the Pch MOSFET 20 is manufactured. Subsequently, the operation and effects of the semiconductor device according to the present embodiment configured as described above will be described.

In the semiconductor device according to the present embodiment configured as described above, both of the Nch MOSFET 10 and the Pch MOSFET 20 operate by applying a predetermined gate voltage to the gate electrodes 17 and 27.

Specifically, in the Nch MOSFET 10, when a positive voltage is applied as a gate voltage to the gate electrode 17, electrons are attracted to the p-type body layer 11 to form an inversion layer, blow the gate electrode 17, that is, in a portion of the gate electrode 17 which is in contact with the STI film 16 configuring the gate insulating film. As a result, a current is caused to flow between the source and the drain.

On the other hand, in the Pch MOSFET 20, when a negative voltage is applied as a gate voltage to the gate electrode 27, holes are attracted to the n-type body layer 21 to form an inversion layer, below the gate electrode 27, that is, in a portion of the gate electrode 27 which is in contact with the STI film 26 configuring the gate insulating film. As a result, a current is caused to flow between the source and the drain.

However, in the Pch MOSFET 20, since the buried n-type region 21a is provided in the n-type body layer 21, the buried n-type region 21a is lower in the carrier concentration than the other portions of the n-type body layer 21, and the inversion layer is more easily formed. Therefore, even when the thickness of the STI film 26 is increased, the threshold voltage Vt can be restricted from increasing, in more detail, the negative voltage as the gate voltage can be restricted from becoming a high value on a negative side. This makes it possible to restrict an increase in operating voltage of a circuit in which the Pch MOSFET 20 included in the semiconductor device according to the present embodiment is incorporated, and makes it possible to reduce a power consumption.

In particular, when the STI film 26 is used, since the STI film 26 can be formed simultaneously with the STI structure for element isolation, the manufacturing process can be simplified. On the other hand, since the STI film 26 is not a dense film as compared with the LOCOS film, a thicker film is required for the purpose of realizing the same reliability as that of the LOCOS film. For that reason, although the threshold voltage Vt tends to be high, the formation of the buried n-type region 21a can restrict the threshold voltage Vt from increasing as in the present embodiment. Therefore, in the structure using the STI film 26 as the gate insulating film, it is effective to provide the buried n-type region 21a.

Furthermore, in the case of forming the buried n-type region 21a, a channel can be provided at a position slightly deeper than a boundary surface with the STI film 26 in the buried n-type region 21a, and a region with higher crystallinity can be used as the channel to provide a semiconductor device excellent in characteristics.

In addition, in the buried n-type region 21a, the overall n-type impurity concentration of the n-type body layer 21 is not lowered, but only the surface portion of the n-type body layer 21 is lowered. For that reason, in a portion of the n-type body layer 21 other than the buried n-type region 21a, the n-type impurity concentration can be kept relatively high, and the threshold voltage Vt can be lowered while securing an on-breakdown voltage.

In the present embodiment, the buried n-type region 21a is provided in a part of the n-type body layer 21, but the accumulation region is provided by the n-type active layer 33. In other words, the n-type semiconductor having a lower impurity concentration than that of the n-type body layer 21 is disposed between the n-type body layer 21 and the p-type drift layer 23. For that reason, a partial high concentration portion is not formed in the p-type drift layer 23 as in the case of forming the p-type surface diffusion layer disclosed in Patent Literature 1. Therefore, as in the case where the partial high concentration portion is generated in the p-type drift layer 23, a reduction in the breakdown voltage caused by an electric field concentration can be prevented from occurring with a distribution in which equipotential lines are concentrated.

Furthermore, when ion implantation of p-type impurities is performed to form the buried n-type region 21a, the implantation amount of the p-type impurity may increase so that the buried n-type region 21a may put into the p-type. However, even in that case, since the accumulation region configured by the n-type semiconductor is provided, the interposition of the accumulation region can restrict the overall region between the source and drain from being connected by the p-type layer. Therefore, an increase in the leakage current between the source and the drain can be restricted.

In addition, the accumulation region makes it possible to increase a distance between the n-type body layer 21 and the p-type drift layer 23. For that reason, an electric field applied to a p-n junction between the n-type body layer 21 and the p-type drift layer 23 at the time of reverse bias can be lowered as compared with a structure in which the n-type body layer 21 and the p-type drift layer 23 are in direct contact with each other.

In addition, the p-type drift layer 23 is thermally diffused in the accumulation region due to annealing or the like during the manufacturing process. For that reason, the p-type impurity concentration of the p-type drift layer 23 gradually decreases toward the n-type body layer 21. In other words, as in the structure without the p-type drift layer 23, the impurity concentration does not change sharply at the p-n junction between the p-type buffer layer 24 and the active layer 33. Therefore, since the electric field applied to the junction between the n-type body layer 21 and the p-type drift layer 23 at the time of reverse bias can be lowered by allowing the p-type drift layer 23 to function as a resurf layer, the threshold voltage Vt can be lowered without reduction in the off-breakdown voltage.

Incidentally, in the structure shown in the present embodiment, a structure without the p-type buffer layer 24 can be adopted, but also in this case, since the p-type drift layer 23 is formed, the advantages described above can be obtained. Also, in the Nch MOSFET 10, although the n-type buffer layer 14 can be eliminated. Even in this case, since the n-type drift layer 23 is formed to gradually change the impurity concentration, the same advantages as those described above can be obtained.

Figure 5A:
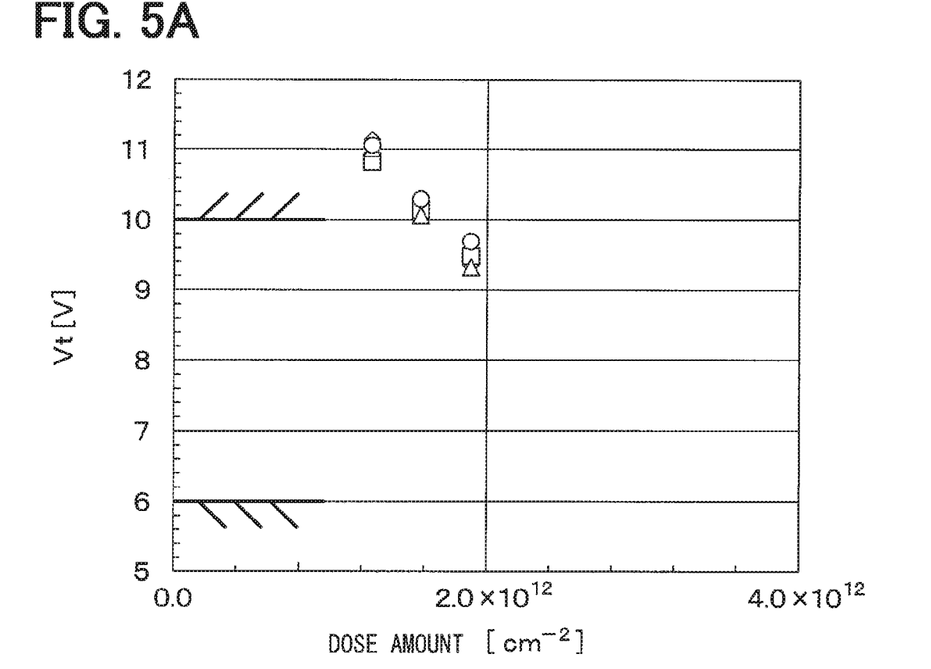
FIG. 5A is a graph showing a relationship between a dose amount and a threshold voltage Vt when forming a p-type body layer in the Nch MOSFET.

Furthermore, in the semiconductor device according to the present embodiment, the Nch MOSFET 10 and the Pch MOSFET 20 are formed on the same substrate, and the active layer 33 is formed of an n-type semiconductor. In the case of such a structure, in the Nch MOSFET 10, the p-type impurity is ion-implanted into the n-type active layer 33 to form the p-type body layer 11 configuring a channel region. For that reason, the carrier concentration can easily be set to be low by lowering the p-type impurity concentration, and the threshold voltage Vt can easily be set to be low. More specifically, as shown in FIG. 5A, when the conductivity type of the body layer for configuring the channel region is of the conductivity type opposite to that of the substrate forming the body layer, in this example, the active layer 33, the threshold voltage Vt can be lowered more as the dose amount of ion implantation is increased more. Therefore, the threshold voltage Vt can easily be set to be low.

Figure 5B:
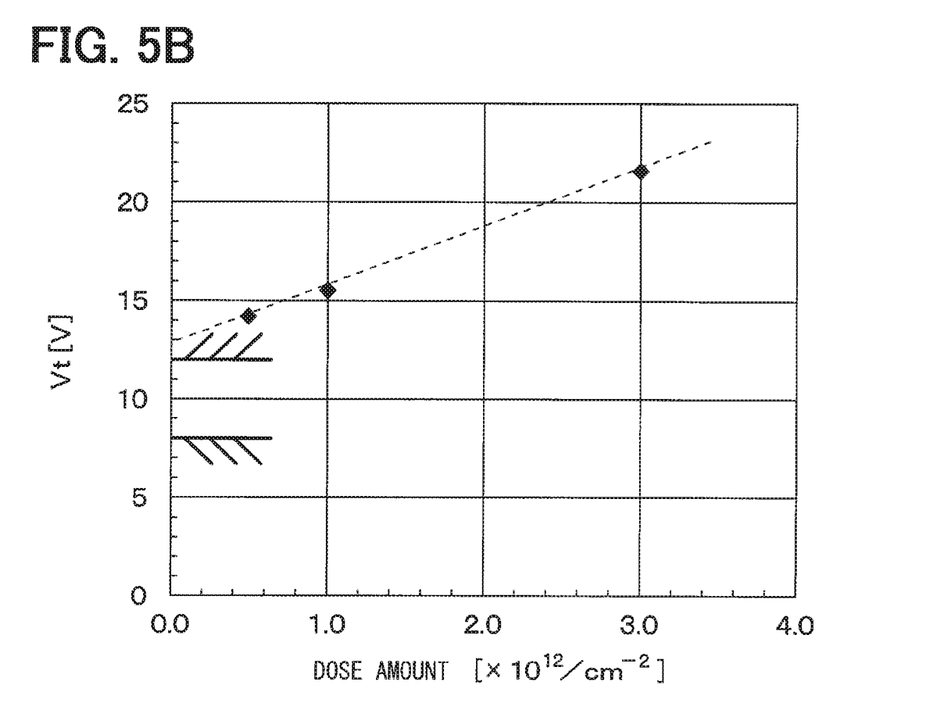
FIG. 5B is a graph showing a relationship between the dose amount and the threshold voltage Vt when forming an n-type body layer in the Pch MOSFET.

On the other hand, in the Pch MOSFET 20, the n-type body layer 21 configuring the channel region is formed by ion implanting the n-type impurity into the n-type active layer 33. For that reason, the n-type impurity is further implanted in addition to the n-type impurity concentration of the active layer 33 to form the n-type body layer 21. Even if it is attempted to lower the n-type impurity concentration, the carrier concentration is hardly set to be low, and the threshold voltage Vt is hardly set to be low. More specifically, when the conductivity type of the body layer for forming the channel region is the same conductivity type as that of the substrate forming the body layer, in this example, the active layer 33, as shown in FIG. 5B, the threshold voltage Vt increases more as the dose amount of ion implantation increases more.

Therefore, the threshold voltage Vt cannot easily be set to be low. Therefore, as in the present embodiment, the p-type impurity is ion-implanted into the n-type body layer 21 to form the buried n-type region 21a, thereby being capable of easily setting the carrier concentration of the buried n-type region 21a to be low, and easily setting the threshold voltage Vt.

As described above, in the present embodiment, the buried n-type region 21a is provided in the surface layer portion of the n-type body layer 21 of the Pch MOSFET 20. This makes it possible to lower the threshold voltage Vt. Since the n-type impurity concentration of the portion of the n-type body layer 21 other than the buried n-type region 21a is kept relatively high, the threshold voltage Vt can be lowered while ensuring the on-breakdown voltage. Furthermore, since the accumulation region is configured by the n-type active layer 33, a partial high concentration portion is not formed in the p-type drift layer 23 as in the case of forming the p-type surface diffusion layer disclosed in Patent Literature 1. Therefore, as in the case where the partial high concentration portion is generated in the p-type drift layer 23, a reduction in the breakdown voltage caused by an electric field concentration can be prevented from occurring with a distribution in which equipotential lines are concentrated.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, in the embodiment described above, a structure in which the buried n-type region 21a is formed in the Pch MOSFET 20 in which the first conductivity type is the n-type, the second conductivity type is the n-type, and the p-type channel is formed as the second conductivity type channel has been described. This is because the second conductivity type channel has the conductivity type opposite to the active layer 33. In other words, the structure described in the above embodiment can be applied to a case in which the first conductivity type buried region is formed in the case of configuring the second conductivity type channel for the first conductivity type semiconductor. Specifically, in the case of forming an LDMOS for the p-type semiconductor, the same advantages as those in the above embodiment can be obtained by forming the buried p-type region in the surface layer portion of the p-type body layer 11 of the Nch MOSFET 10.

In the embodiment described above, the n-type drift layer 13 is provided for the Nch MOSFET 10 to improve the breakdown voltage, but the n-type drift layer 13 may not be provided. Although the n-type buffer layer 14 and the p-type buffer layer 24 are formed in the Nch MOSFET 10 and the Pch MOSFET 20, respectively, those buffer layers may not be provided. Even in the case where the n-type buffer layer 14 is not provided, the n$^+$-type drain region 15 may be directly disposed in the active layer 33, or in the case where the n-type drift layer 13 is provided, the n$^+$-type drain region 15 may be disposed in the active layer 33 through the n-type drift layer 13. Likewise, in the case of a structure having no p-type buffer layer 24, the p$^+$-type drain region 25 may be directly disposed in the p-type drift layer 23.

In the embodiment described above, with the use of the SOI substrate 30 as the semiconductor substrate having the semiconductor layer forming the LDMOS, the active layer 33 formed of a part of the SOI substrate 30 as the semiconductor layer of the first conductivity type in which the LDMOS is formed has been exemplified. However, this is merely an example of the semiconductor substrate provided with the semiconductor layer of the first conductivity type, and a semiconductor substrate of another structure may be used. For example, the LDMOS may be formed of a simple silicon substrate. In that case, if the silicon substrate is made of a first conductivity type semiconductor, for example, the n-type, the structure described in the embodiment described above may be applied when forming the Nch MOSFET 10 and the Pch MOSFET 20 on the silicon substrate.

In the embodiment described above, the STI films 16 and 26 are used as the gate insulating film, but the same structure as that in the above embodiment can be applied also when the LOCOS film is used.

In the embodiment described above, the case of manufacturing the Nch MOSFET 10 and the Pch MOSFET 20 by the manufacturing processes shown in FIGS. 3A to 3 H and FIGS. 4A to 4 I has been described, but this is merely one example. For example, the formation order of the respective impurity layers is arbitrary, and any impurity layer may be formed first. However, as far as the same mask is used for the ion implantation of the n-type impurity in forming the n-type body layer 21 and the ion implantation of the p-type impurity for forming a part of the n-type body layer 21 into the buried n-type region 21a, those ion implantations are continuously performed although those ion implantations may be performed before and after.

The invention claimed is:

1. A semiconductor device comprising:
    an LDMOS of a second conductivity type channel including:
        a semiconductor substrate that includes a semiconductor layer of a first conductivity type;
        a body layer of the first conductivity type which is disposed in the semiconductor layer and has an impurity concentration higher than that of the semiconductor layer;
        a source region of a second conductivity type which is terminated in the body layer and disposed in a surface layer portion of the body layer;
        a drift layer of the second conductivity type which is disposed away from the body layer in the semiconductor layer;
        a drain region of the second conductivity type which is disposed in the drift layer and has an impurity concentration higher than that of the drift layer;
        a gate insulating film that is disposed between the source region and the drain region;
        a gate electrode that is disposed on a portion of the gate insulating film, the portion corresponding to a portion of the gate insulating film which is in contact with the body layer;
        a source electrode that is connected to the source region; and
        a drain electrode that is connected to the drain region, wherein
        the body layer has a portion configuring a channel region at a position in contact with the gate insulating film, and the portion configuring the channel region is a buried region that contains impurities of the second conductivity type and has a lower carrier concentration than that of a remaining portion of the body layer.

2. The semiconductor device according to claim 1, wherein
    the drift layer has a second conductivity type impurity concentration that lowers toward the body layer.

3. The semiconductor device according to claim 1, further comprising:
    a buffer layer of the second conductivity type which is terminated in the drift layer and has an impurity concentration higher than that of the drift layer, wherein the drain region is terminated in the buffer layer of the second conductivity type and has an impurity concentration higher than that of the buffer layer.

4. The semiconductor device according to claim 1, wherein
in the LDMOS of the second conductivity type channel, the body layer is referred to as a first body layer, the source region is referred to as a first source region, the drift layer is referred to as a first drift layer, the drain region is referred to as a first drain region, the gate insulating film is referred to as a first gate insulating film, the source electrode is referred to as a first source electrode, and the drain electrode is referred to as a first drain electrode,
the semiconductor substrate is provided with an LDMOS of a first conductivity channel, the LDMOS of the first conductivity channel includes:
a second body layer of the second conductivity type which is disposed in the semiconductor layer;
a second source region of the first conductivity type which is terminated in the second body layer and disposed in a surface layer portion of the second body layer;
a second drain region of the first conductivity type which is disposed in the semiconductor layer and has an impurity concentration higher than that of the semiconductor layer;
a second gate insulating film which is disposed between the second source region and the second drain region;
a second gate electrode that is disposed on a portion of the second gate insulating film, the portion corresponding to a portion of the second gate insulating film which is in contact with the second body layer;
a second source electrode that is connected to the second source region; and
a second drain electrode that is connected to the second drain region.

5. The semiconductor device according to claim 4, wherein
the LDMOS of the first conductivity type channel includes a buffer layer of the first conductivity type which is disposed away from second body layer in the semiconductor layer, and
the second drain region is terminated in the buffer layer of the first conductivity type and has an impurity concentration higher than that of the buffer layer.

6. A method for manufacturing a semiconductor device having an LDMOS of a second conductivity type channel relative to a semiconductor substrate having a semiconductor layer of a first conductivity type, the method comprising:
preparing the semiconductor substrate;
forming a gate insulating film at a predetermined position of the semiconductor layer;
forming a drift layer of a second conductivity type in the semiconductor layer;
forming a body layer of the first conductivity type having an impurity concentration higher than that of the semiconductor layer at a position distant from the drift layer in the semiconductor layer;
forming a source region of the second conductivity type which is terminated in the body layer in a surface layer portion of the body layer located at one end of the gate insulating film;
forming a drain region of the second conductivity type in a surface layer portion of the drift layer and at another end of the gate insulating film, the drain region having an impurity concentration higher than that of the drift layer;
forming a gate electrode on a portion of the gate insulating film, the portion corresponding to a portion of the gate insulating film which is in contact with the body layer;
forming a source electrode that is connected to the source region; and
forming a drain electrode that is connected to the drain region, wherein
the forming the body layer includes forming a buried region having a carrier concentration lower than that of a remaining portion of the body layer by ion implanting a second conductivity type impurity into a portion of the body layer which configures a channel region in contact with the gate insulating film.

7. The method for manufacturing the semiconductor device according to claim 6, further comprising
forming a buffer layer of the second conductivity type which is terminated in the drift layer and has an impurity concentration higher than that of the drift layer, wherein
the forming the drain region includes forming of the drain region so that the drain region is terminated in the buffer layer and has an impurity concentration higher than that of the buffer layer.

8. The method for manufacturing the semiconductor device according to claim 6, wherein
the forming the body layer includes forming the body layer by ion implanting the first conductivity type impurity into the semiconductor layer, and
the ion implantation of the first conductivity type impurity and the ion implantation of the second conductivity type impurity to form the buried region are performed using a same mask.

* * * * *